(12) United States Patent
Hayes et al.

(10) Patent No.: US 7,985,659 B1
(45) Date of Patent: Jul. 26, 2011

(54) SEMICONDUCTOR DEVICE WITH A CONTROLLED CAVITY AND METHOD OF FORMATION

(75) Inventors: Scott M. Hayes, Chandler, AZ (US); Dwight L. Daniels, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/750,929

(22) Filed: Mar. 31, 2010

(51) Int. Cl.
*H01L 21/30* (2006.01)
*H01L 21/00* (2006.01)
*H01L 27/14* (2006.01)

(52) U.S. Cl. ........................ 438/456; 438/48; 257/414

(58) Field of Classification Search .................... None
See application file for complete search history.

(56) References Cited

U.S. PATENT DOCUMENTS

| | | | |
|---|---|---|---|
| 6,610,582 B1 * | 8/2003 | Stewart | 438/455 |
| 6,635,509 B1 | 10/2003 | Ouellet | |
| 6,713,828 B1 | 3/2004 | Chavan et al. | |
| 6,846,725 B2 * | 1/2005 | Nagarajan et al. | 438/456 |
| 6,930,364 B2 * | 8/2005 | Bruner | 257/414 |
| 7,344,907 B2 * | 3/2008 | Colgan et al. | 438/51 |
| 7,585,743 B2 | 9/2009 | Renna et al. | |
| 7,597,005 B2 | 10/2009 | McMonigal | |
| 7,598,125 B2 | 10/2009 | Shao et al. | |
| 7,598,588 B2 | 10/2009 | Davies | |
| 7,700,457 B2 * | 4/2010 | Diem et al. | 438/456 |
| 7,723,141 B2 * | 5/2010 | Robert | 438/48 |
| 2005/0250253 A1 * | 11/2005 | Cheung | 438/125 |
| 2008/0290430 A1 * | 11/2008 | Mahadevan et al. | 257/418 |
| 2008/0308920 A1 * | 12/2008 | Wan | 257/685 |
| 2009/0294974 A1 * | 12/2009 | Leung et al. | 257/772 |

* cited by examiner

*Primary Examiner* — Scott B Geyer

(57) ABSTRACT

A method for forming a semiconductor device includes providing a first cap wafer having a first opening extending through the first cap wafer, and a second cap wafer bonded to the first cap wafer, wherein the second cap wafer has a second opening extending through the second cap wafer, and wherein the first opening is misaligned with respect to the second opening. After the providing the first cap wafer and second cap wafer, the second cap wafer is bonded to a device wafer, wherein a cavity is formed between the device wafer and the second cap wafer, and wherein the device wafer comprises at least one semiconductor device in the cavity. After the bonding the second cap wafer to the device wafer, a vacuum is applied, wherein during the applying the vacuum, a sealing layer is formed over the first cap wafer, wherein the sealing layer seals the first opening.

20 Claims, 3 Drawing Sheets

SEMICONDUCTOR DEVICE WITH A CONTROLLED CAVITY AND METHOD OF FORMATION

BACKGROUND

1. Field

This disclosure relates generally to semiconductors, and more specifically, to semiconductors having a vacuum cavity.

2. Related Art

Micro-Electro-Mechanical Systems (MEMS) are implemented in a variety of products such as micro-gyroscopes and micro-accelerometers. Micro-gyroscopes require a sealed cavity or enclosure that is at a known atmospheric condition. Implementing a suitable package for very miniature devices with a sealed cavity is problematic, particularly when the chamber needs to be at vacuum. In one process a device wafer with edge standoffs formed of a sealant is placed on a heated chuck or platform. Once the device wafer is sufficiently heated, the chuck is moved toward a suspended cap wafer which also has standoffs formed of a sealant. When the standoffs of the two wafers contact, a cavity next to devices on the device wafer is formed. Radiation heat must be used from the heated chuck to sufficiently heat sealant of both the cap wafer and the device wafer. The required radiation heat can damage and modify the electrical properties of the device wafer which cause incorrect operation. The reliability of the sealing capability of two pressed sealing materials that are compressed when heated is an issue as the strength of the bond does not hold a vacuum long term.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

There is herein disclosed a semiconductor device having a device wafer connected to two overlying cap wafers to create a sealed cavity for forming a vacuum in the cavity. A vent is formed in the two overlying cap wafers by using non-aligned openings in the two overlying cap wafers. At least one opening is present in each cap wafer. A vacuum is applied to the cavity by placing the semiconductor device in a vacuum chamber. The non-aligned openings are used during the application of the vacuum as a vent pathway. The vent pathway permits contaminants from a surface of the device wafer to be outgassed external to the semiconductor device as a vacuum is established in the cavity. The at least one opening in an uppermost overlying cap wafer is sealed from above, thereby creating a semiconductor device having a cavity with a vacuum. In one form the semiconductor device may be used to implement a miniaturized gyroscope for a micro-electromechanical (MEM) system product.

The semiconductor device wafer described herein can be any semiconductor material or combinations of materials, such as gallium arsenide, silicon germanium, silicon-on-insulator (SOI), silicon, monocrystalline silicon, the like, and combinations of the above. In one form the cap wafers described herein are formed of silicon but may also be formed using any of these materials.

Figure 1:
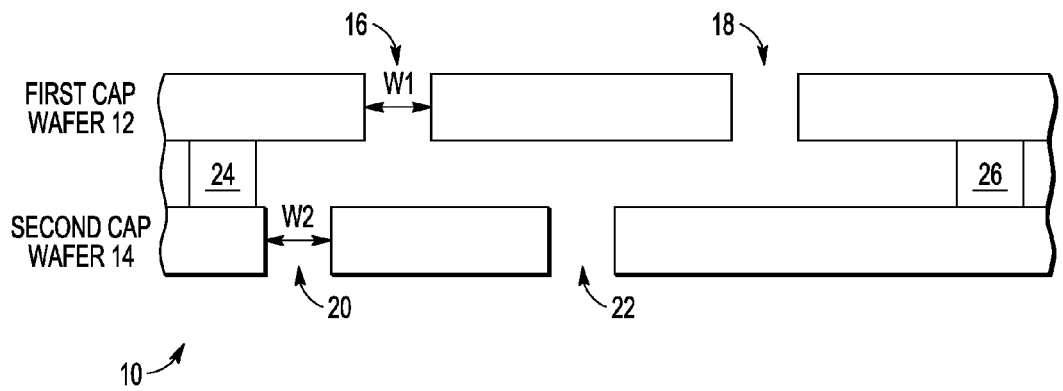
FIGS. 1-3 illustrate in cross-sectional form an exemplary form of a semiconductor device having two joined cap wafers with non-aligned openings using the principles of the present invention.

Illustrated in FIG. 1 is a semiconductor device 10 having a first cap wafer 12 joined to a second cap wafer 14 via a bonding layer having a bond 24 and a bond 26. In the illustrated form the first cap wafer 12 is positioned above the second cap wafer 14. The first cap wafer 12 has preformed openings such as opening 16 and opening 18. The opening 16 is illustrated as having a width W1. Each of openings 16 and 18 may or may not be implemented with a same width and length dimension. The first cap wafer 12 in one form is a silicon wafer and is previously patterned using conventional semiconductor processing to form the openings 16 and 18. In the illustrated form an upper surface of the first cap wafer 12 is a first major surface and the lower surface of the first cap wafer 12 is a second major surface. The second cap wafer 14 also has preformed openings such as opening 20 and opening 22. The opening 20 is illustrated as having width W2. Each of the openings 20 and 22 may or may not be implemented with a same width and length dimension. Further, the dimensions W1 and W2 may or may not be the same value. It should be understood that while each of the first cap wafer 12 and the second cap wafer 14 is illustrated as having two openings, any number of openings, including only one, may be implemented in each of cap wafers. None of the openings of the first cap wafer 12 vertically align with openings in the second cap wafer 14. Thus the openings of the first cap wafer 12 are misaligned with the openings of the second cap wafer 14 so that there is no overlap in a vertical plane. The first cap wafer 12 is wafer bonded to the second cap wafer 14 via bonds 24 and 26 which result in a physical standoff to create a path for a gas to flow between the two cap wafers and through the openings 16, 18, 20 and 22. The bonds 24 and 26 may be implemented with any of numerous sealing materials to form a pressure sealed environment in which a known pressure/vacuum is maintained. For example a conventional glass frit may be used to bond the two cap layers together and provide a seal that is sufficient to maintain a vacuum.

Figure 2:
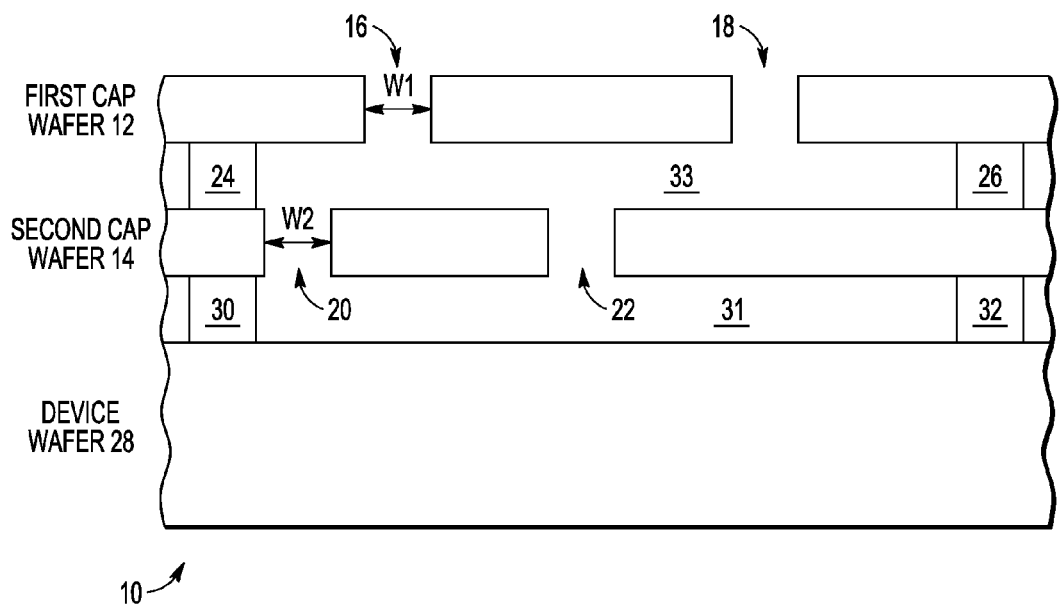

Illustrated in FIG. 2 is further processing of semiconductor device 10 in which the bonded first cap wafer 12 and second cap wafer 14 are bonded to a device wafer 28 via a bond 30 and a bond 32. Device wafer 28 is a semiconductor wafer which has previously formed semiconductor structures (not shown) formed on an upper surface that faces the second cap wafer 14. The bonds 30 and 32 may be implemented with any of numerous sealing materials such as glass frit to form a pressure sealed environment in which a known pressure/vacuum is maintained. The bonding of the second cap wafer 14 to the device wafer 28 forms a cavity 31. Access to cavity 31 may be obtained from external to the semiconductor device 10 via the openings 16 and 18 through a vent path 33 and openings 20 and 22.

In the illustrated form of FIG. 2, the semiconductor device 10 may be placed in a vacuum chamber where a vacuum is established in cavity 31 at a slightly elevated temperature. By way of example only, a vacuum of 1 mTorr or less is typically formed in a vacuum chamber. The temperature, while above room temperature typically, nonetheless is very low as compared with the higher temperatures commonly associated with semiconductor manufacturing. Therefore, potential damage or modification to fabricated circuits in the device wafer 28 is avoided. As the vacuum is being formed in cavity 31, various surface contaminants on the top surface of the device wafer 28 that forms cavity 31 are lifted and removed through the vent path 33 and released from internal to the semiconductor device 10. During this process the cavity 31 becomes a vacuum cavity. Additionally, various gasses from the device wafer 28 may be removed during the creation of a vacuum in the cavity 31.

Figure 3:
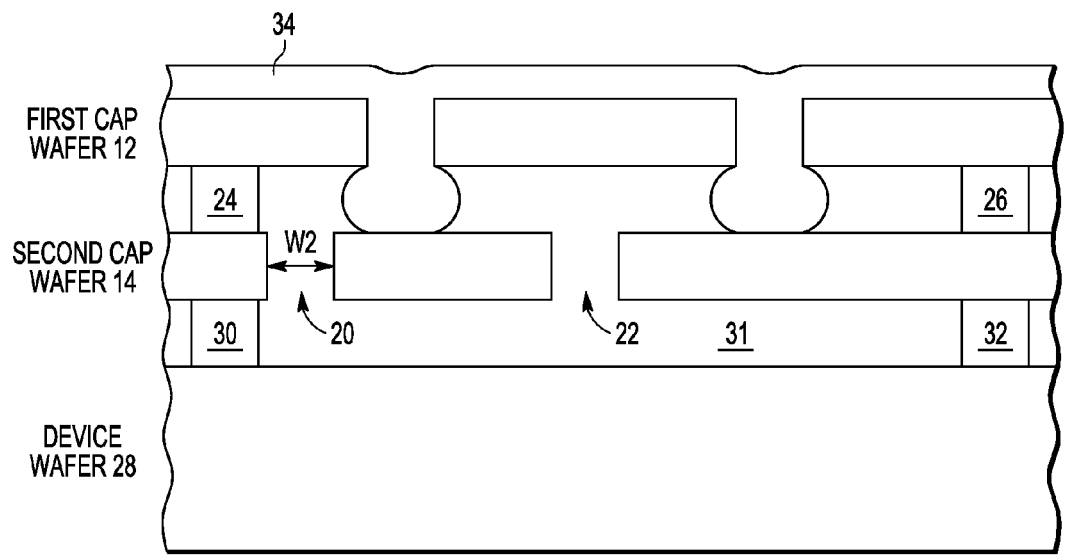

In the illustrated form of FIG. 3, the semiconductor device 10 has the openings 16 and 18 sealed while the semiconductor device is under vacuum to establish a gas atmosphere in cavity 31 that is under vacuum. The method used to seal openings 16 and 18 implements the formation of a sealing material in the openings 16 and 18 having a composition that is determined in part by what type of sealing method is selected. In one form a spun-on dielectric material that is epoxy based may be spun onto the semiconductor device 10 to create the sealing layer 34. Another spin-on material which is suitable is glass. After a spin-on material or printed material is formed, the sealing material is then cured under vacuum. In another form a sealing material may be deposited, sputtered or chemically vapor deposited. For example, if a sputtering method is used, a metal such as copper, aluminum, gold or a metal alloy may be sputtered. Another form of sealing of the opening 16 and opening 18 is the use of an epoxy material formed by a stencil printed epoxy. In yet another method, opening 16 and opening 18 are sealed by the growth of an oxide layer as the sealing layer 34. In yet another form the sealing layer 34 may be implemented by a plurality of microparticles, such as nanoclusters, which will fill the openings 16 and 18. An oxide may be formed, typically by deposition, around the microparticles to complete a pressure sealed closure of the openings 16 and 18. This sealed closure maintains a known pressure or a vacuum. It should be understood that the first cap wafer 12, the second cap wafer 14 and the device wafer 28 illustrate only a portion of a semiconductor wafer having a plurality of functional semiconductor die which are singulated into individual semiconductor die.

Figure 4:
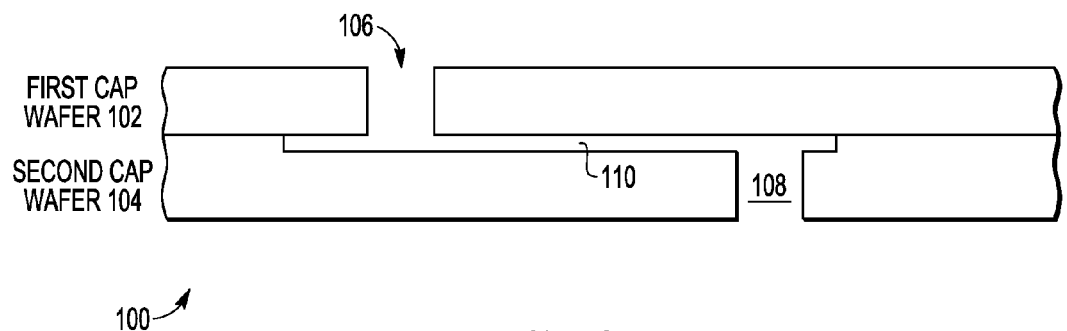
FIGS. 4-6 illustrate in cross-sectional form another exemplary form of a semiconductor device having two joined cap wafers with non-aligned openings using the principles of the present invention.

Illustrated in FIG. 4 is a semiconductor device 100 formed using another exemplary method. A first cap wafer 102 is provided having a first major surface, e.g. the upper surface, a second major surface, e.g. the lower surface, and an opening 106. A second cap wafer 104 is provided having a first major surface, e.g. the upper surface, in which a channel 110 has been etched in the first major surface. A lower surface of the second cap wafer 104 is a second major surface. The second cap wafer 104 has an opening 108 at some point along the channel 110 that extends through (i.e. entirely through) the second cap wafer 104. The opening 108 in the second cap wafer 104 does not vertically align with the opening 106 in the first cap wafer 102. In the illustrated form, while only a single opening is illustrated in each of the first cap wafer 102 and the second cap wafer 104, it should be understood that additional openings in either cap wafer may be formed as long as the openings in the adjoined cap wafers do not vertically align with each other. The first cap wafer 102 and the second cap wafer 104 are laminated or otherwise affixed together so that no separation distance exists between the first cap wafer 102 and the second cap wafer 104 other than at the channel 110 interface. In one form an adhesive film is placed between the first cap wafer 102 and the second cap wafer 104 in areas outside of the channel 110.

Figure 5:
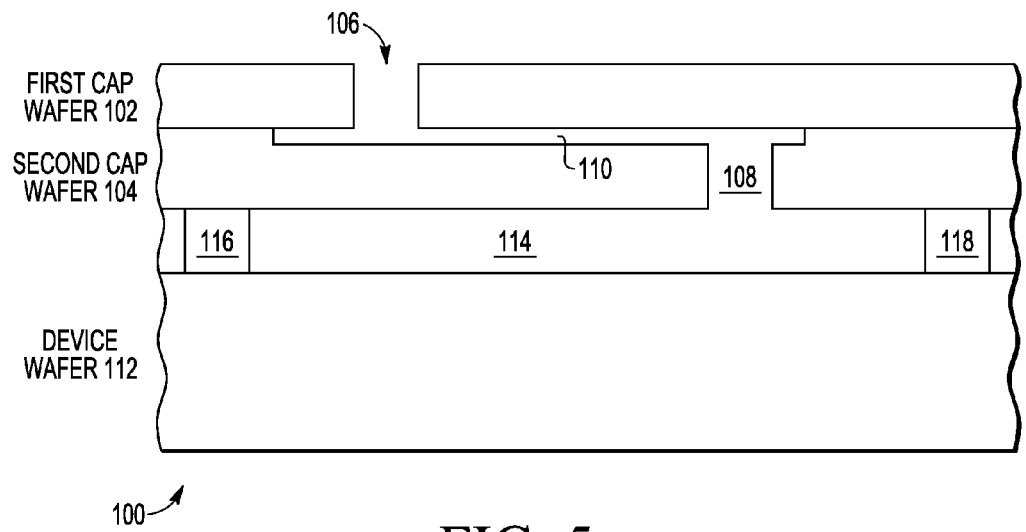

Illustrated in FIG. 5 is a cross-section of the method of forming semiconductor device 100 wherein a device wafer 112 is provided and bonded via a device-to-cap bond 116 and a device-to-cap bond 118. The resulting bonding of the device wafer 112 to the second major surface of the second cap wafer 104 via device-to-cap bonds 116 and 118 creates a cavity 114.

In the illustrated form, an opening 106 provides a passage for a gas to flow through the vent path 110 formed from the trench in the first major surface of the second cap wafer 104 to the opening 108. In one form the trench in the second cap wafer 104 is of substantially constant depth, but it does not necessarily need to be. The widths of opening 106 and opening 108 may be the same or may differ. At this point in the method, the semiconductor device 100 may be placed in a vacuum chamber and a vacuum formed in the cavity 114. The formation of the vacuum in cavity 114 is analogous to that described in connection with FIGS. 1-3. A low temperature formation of a vacuum is achieved. The width of the opening of the vent path 110 will determine in part the rate of flow of gas. To decrease the amount of time required to establish a vacuum in cavity 114, the depth of the channel which is etched in the first major surface of the second cap wafer 104 may be increased to be deeper. Alternative forms include the formation of a trench in the second major surface of the first cap wafer 102 between the opening 106 and the opening 108 rather than forming a trench in the second cap wafer 104. Another form is to include the formation of a trench in each of the first cap wafer 102 and the second cap wafer 104 which coincide in location between opening 106 of the first cap wafer 102 and the second cap wafer 104 when the two cap layers are adjoined by an adhesive.

Figure 6:
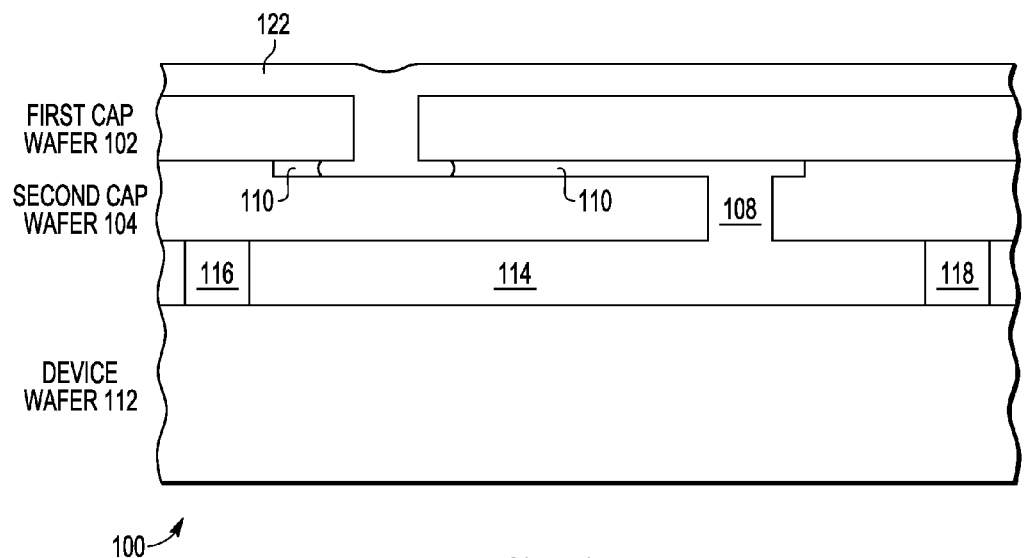

Illustrated in FIG. 6 is further processing of semiconductor device 100 wherein while the semiconductor device 100 is in the vacuum chamber, a sealing layer 122 is formed over the first cap wafer 102 to seal the opening 106 and form a sealed cavity 114 that is under vacuum. Active circuitry (not shown), i.e. a semiconductor device, is within the device wafer 112 and on the major surface of the device wafer 112 so that the semiconductor device interfaces the cavity 114 and may implement predetermined functions, such as a gyroscope function. The semiconductor device 100 represents a single device that has been singulated from an entire wafer having the first cap wafer 102, the second cap wafer 104 and the device wafer 112. The method used to seal opening 106 implements the formation of a sealing material in the opening 106 having a composition that is determined in part by what type of sealing method is selected. In one form a spun-on dielectric material that is epoxy based may be spun onto the semiconductor device 100 to create the sealing layer 122. Another spin-on material which is suitable is glass. After a spin-on material or printed material is formed, the sealing material is then cured under vacuum. In another form a sealing material may be deposited, sputtered or chemically vapor deposited. For example, if a sputtering method is used, a metal such as copper, aluminum, gold or a metal alloy may be sputtered. Another form of sealing of the opening 106 is the use of an epoxy material formed by a stencil printed epoxy. In yet another method, opening 106 is sealed by the growth of an oxide layer as the sealing layer 122. In yet another form the sealing layer 122 may be implemented by a plurality of microparticles, such as nanoclusters, which will fill the opening 106. An oxide may be formed, typically by deposition, around the microparticles to complete a seal of the opening 106. Again, it should be understood that the illustrated form of the first cap wafer 102, the second cap wafer 104 and the device wafer 112 is only a portion of bonded wafers having a plurality of functional semiconductor die which are singulated into individual semiconductor die.

By now it should be appreciated that there has been provided a semiconductor structure and method for forming a vent pathway using a wafer cap structure that is applied to a die-level cavity device. A vent pathway is covered or sealed while the semiconductor device is under vacuum and after two wafer caps have been attached via a wafer bond to a functional semiconductor wafer having active devices formed therein. At least one hole is formed in each of the two wafer caps and the holes of the two wafer caps do not vertically align. As a result, a sealing layer that is used to seal the at least one hole of the uppermost wafer cap settles on an exposed surface of the underlying wafer cap. The openings in the two wafer caps and an interconnecting vent path permit the application of a vacuum and a sealing of the device after bonding of the two wafer caps has occurred and after the two wafer caps have been bonded to a device wafer. The prefabrication of the wafer caps to have openings or vents allows parallel processing of many semiconductor wafers and improves the volume manufacture through-put while having reliable yields.

In one form there is herein provided a method for forming a semiconductor device. A first cap wafer is provided having a first opening extending through the first cap wafer. A second cap wafer is bonded to the first cap wafer, wherein the second cap wafer has a second opening extending through the second cap wafer. The first opening is misaligned with respect to the second opening. After providing the first cap wafer and the second cap wafer is bonded to the first cap wafer, the second cap wafer is bonded to a device wafer. A cavity is formed between the device wafer and the second cap wafer. The device wafer has at least one semiconductor device exposed to the cavity. After bonding the second cap wafer to the device wafer, a vacuum is applied to the first cap wafer, the second cap wafer, and the device wafer. During the applying the vacuum a sealing layer is formed over the first cap wafer, wherein the sealing layer seals the first opening.

In another form the providing of the first cap wafer and the second cap wafer that is bonded to the first cap wafer is further characterized in that the first cap wafer has a first major surface and a second major surface opposite the first major surface. The second cap wafer has a first major surface and a second major surface opposite the first major surface. The second major surface of the first cap wafer is between the first major surface of the first cap wafer and the first major surface of the second cap wafer. The first major surface of the second cap wafer is between the second major surface of the first cap wafer and the second major surface of the second cap wafer. The second major surface of the first cap wafer is bonded to the first major surface of the second cap wafer.

In another form providing the first cap wafer and the second cap wafer bonded to the first cap wafer is further characterized in that the second major surface of the first cap wafer is bonded to the first major surface of the second cap wafer with a bonding layer. The second major surface of the first cap wafer is spaced apart from the first major surface of the second cap wafer such that a vent path is present from the first opening to the second opening, between the second major surface of the first cap wafer and the first major surface of the second cap wafer.

In another form providing the first cap wafer and the second cap wafer bonded to the first cap wafer is further characterized in that at least one of the second major surface of the first cap wafer or the first major surface of the second cap wafer includes a trench such that a vent path is present from the first opening to the second opening via the trench. In yet another form providing the first cap wafer and the second cap wafer bonded to the first cap wafer is further characterized in that the first cap wafer and the second cap wafer are laminated together. In another form providing the first cap wafer and the second cap wafer bonded to the first cap wafer is further characterized in that the first cap wafer has a first plurality of openings, each extending through the first cap wafer, wherein the first plurality of openings includes the first opening, and the second cap wafer has a second plurality of openings, each extending through the second cap wafer, wherein the second plurality of openings includes the second opening. In another form the providing the first cap wafer and the second cap wafer bonded to the first cap wafer is further characterized in that each opening of the first plurality of openings is misaligned with respect to each opening of the second plurality of openings. In yet another form during the applying the vacuum, the forming the sealing layer over the first cap wafer is further characterized in that the sealing layer seals each opening of the first plurality of openings. In one form the semiconductor device is a micro-electro-mechanical (MEM) device. In another form during the applying the vacuum, the forming the sealing layer over the first cap wafer further includes forming the sealing layer within the first opening.

In another form there is herein provided a method for forming a semiconductor device by providing a first cap wafer having one or more openings extending through the first cap wafer. A second cap wafer is bonded to the first cap wafer, wherein the second cap wafer has one or more openings extending through the second cap wafer. Each of the one or more openings in the first cap wafer is misaligned with respect to each of the one or more openings in the second cap wafer. After the providing the first cap wafer and the second cap wafer bonded to the first cap wafer, the second cap wafer is bonded to a device wafer, wherein a cavity is formed between the device wafer and the second cap wafer. A vent path is present from the cavity through the at least one opening in the second cap wafer and through the at least one opening in the first cap wafer. The device wafer has at least one semiconductor device within the cavity. After the bonding of the second cap wafer to the device wafer, a vacuum is applied to the vent path, wherein during the applying the vacuum, a sealing layer is formed over the first cap wafer. The sealing layer seals each opening of the one or more openings in the first cap wafer, and the first cap layer is located between the sealing layer and the second cap layer.

In another form the providing of the first cap wafer and the second cap wafer bonded to the first cap wafer is further characterized in that the first cap wafer is spaced apart from the second cap wafer. The vent path is present from the cavity through the at least one opening in the first cap wafer, between the first cap wafer and the second cap wafer, and through the at least one opening in the second cap wafer. In another form the providing of the first cap wafer and the second cap wafer bonded to the first cap wafer is further characterized in that at least one of the first cap wafer or the second cap wafer includes a trench. The vent path is present from the cavity through the at least one opening in the first cap wafer, through the trench, and through the at least one opening in the second cap wafer.

In another form the providing of the first cap wafer and the second cap wafer bonded to the first cap wafer is further characterized in that the first cap wafer and the second cap wafer are laminated together. In yet another form the semiconductor device is a MEM device. In yet another form during the applying of the vacuum, the forming of the sealing layer over the first cap wafer further includes forming the sealing layer within the one or more openings in the first cap wafer. In another form the device wafer, the first cap wafer, and the second cap wafer are singulated.

In another form there is provided a semiconductor device having a first cap layer having one or more openings extending through the first cap layer. A second cap layer is bonded to the first cap layer, the second cap layer having one or more openings extending through the second cap layer. Each of the one or more openings in the first cap layer are misaligned with respect to each of the one or more openings in the second cap layer. A sealing layer is formed over the first cap layer, wherein the first cap layer is located between the sealing layer and the second cap layer, and wherein the sealing layer seals each of the one or more openings in the first cap layer. A device layer is bonded to the second cap layer and includes a MEM device. A vacuum cavity is formed between the device layer and the second cap layer, wherein the MEM device is in the cavity. The semiconductor device further includes a vent path from a first opening of the one or more openings in the second cap layer to a second opening of the one or more openings in the first cap layer, the vent path being located between the second cap layer and the first cap layer. A vent path extends from a first opening of the one or more openings in the second cap layer to a second opening of the one or more openings in the first cap layer. The vent path is located in at least one of the first cap layer or the second cap layer.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, various materials other than silicon may be used for the cap wafers and the wafer device. The thickness of the cap wafers may be varied. Generally, each cap wafer may have a minimal thickness which is sufficient to provide sufficient rigidity to the semiconductor device. In one form the cap wafer thickness of each cap wafer is within a range of one hundred microns to two hundred microns. The thickness of the device wafer may vary, but illustrative values are between three hundred and four hundred microns. Therefore, a total height of five hundred microns or less may be achieved and provide a semiconductor device that is rigid for varied applications, such as for a gyroscope or accelerometer implemented as a MEM device.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor device, the method comprising:
   providing a first cap wafer having a first opening extending through the first cap wafer, and a second cap wafer bonded to the first cap wafer, wherein the second cap wafer has a second opening extending through the second cap wafer, wherein the first opening is misaligned with respect to the second opening;
   after the providing the first cap wafer and the second cap wafer bonded to the first cap wafer, bonding the second cap wafer to a device wafer, wherein a cavity is formed between the device wafer and the second cap wafer, and wherein the device wafer comprises at least one semiconductor device exposed to the cavity; and
   after the bonding the second cap wafer to the device wafer, applying a vacuum to the first cap wafer, the second cap wafer, and the device wafer, wherein during the applying the vacuum, the method further comprising:
      forming a sealing layer over the first cap wafer, wherein the sealing layer seals the first opening.

2. The method of claim 1, wherein the providing the first cap wafer and the second cap wafer bonded to the first cap wafer is further characterized in that the first cap wafer has a first major surface and a second major surface opposite the first major surface, and the second cap wafer has a first major surface and a second major surface opposite the first major surface, wherein the second major surface of the first cap wafer is between the first major surface of the first cap wafer and the first major surface of the second cap wafer, and the first major surface of the second cap wafer is between the second major surface of the first cap wafer and the second major surface of the second cap wafer, and wherein second major surface of the first cap wafer is bonded to the first major surface of the second cap wafer.

3. The method of claim 2, wherein the providing the first cap wafer and the second cap wafer bonded to the first cap wafer is further characterized in that the second major surface of the first cap wafer is bonded to the first major surface of the second cap wafer with a bonding layer and wherein the second major surface of the first cap wafer is spaced apart from the first major surface of the second cap wafer such that a vent path is present from the first opening to the second opening, between the second major surface of the first cap wafer and the first major surface of the second cap wafer.

4. The method of claim 2, wherein the providing the first cap wafer and the second cap wafer bonded to the first cap wafer is further characterized in that at least one of the second major surface of the first cap wafer or the first major surface of the second cap wafer includes a trench such that a vent path is present from the first opening to the second opening via the trench.

5. The method of claim 4, wherein the providing the first cap wafer and the second cap wafer bonded to the first cap wafer is further characterized in that the first cap wafer and the second cap wafer are laminated together.

6. The method of claim 1, wherein the providing the first cap wafer and the second cap wafer bonded to the first cap wafer is further characterized in that the first cap wafer comprises a first plurality of openings, each extending through the first cap wafer, wherein the first plurality of openings comprises the first opening, and the second cap wafer comprises a second plurality of openings, each extending through the second cap wafer, wherein the second plurality of openings comprises the second opening.

7. The method of claim 6, wherein the providing the first cap wafer and the second cap wafer bonded to the first cap wafer is further characterized in that each opening of the first plurality of openings is misaligned with respect to each opening of the second plurality of openings.

8. The method of claim 7, wherein during the applying the vacuum, the forming the sealing layer over the first cap wafer is further characterized in that the sealing layer seals each opening of the first plurality of openings.

9. The method of claim 1, wherein the semiconductor device comprises a micro-electro-mechanical (MEM) device.

10. The method of claim 1, wherein during the applying the vacuum, the forming the sealing layer over the first cap wafer further comprises forming the sealing layer within the first opening.

11. A method for forming a semiconductor device, the method comprising:
    providing a first cap wafer having one or more openings extending through the first cap wafer, and a second cap wafer bonded to the first cap wafer, wherein the second cap wafer has one or more openings extending through the second cap wafer, wherein each of the one or more openings in the first cap wafer is misaligned with respect to each of the one or more openings in the second cap wafer;
    after the providing the first cap wafer and the second cap wafer bonded to the first cap wafer, bonding the second cap wafer to a device wafer, wherein a cavity is formed between the device wafer and the second cap wafer, wherein a vent path is present from the cavity through the one or more openings in the second cap wafer and through the one or more openings in the first cap wafer, and wherein the device wafer comprises at least one semiconductor device within the cavity; and
    after the bonding the second cap wafer to the device wafer, applying a vacuum to the vent path, wherein during the applying the vacuum, the method further comprises:
        forming a sealing layer over the first cap wafer, wherein the sealing layer seals each opening of the one or more openings in the first cap wafer, and wherein the first cap wafer is located between the sealing layer and the second cap wafer.

12. The method of claim 11, wherein the providing the first cap wafer and the second cap wafer bonded to the first cap wafer is further characterized in that the first cap wafer is spaced apart from the second cap wafer, and wherein the vent path is present from the cavity through the one or more openings extending through the first cap wafer, between the first cap wafer and the second cap wafer, and through the one or more openings extending through the second cap wafer.

13. The method of claim 11, wherein the providing the first cap wafer and the second cap wafer bonded to the first cap wafer is further characterized in that at least one of the first cap wafer or the second cap wafer includes a trench, and wherein the vent path is present from the cavity through the one or more opening extending through the first cap wafer, through the trench, and through the one or more openings extending through the second cap wafer.

14. The method of claim 13, wherein the providing the first cap wafer and the second cap wafer bonded to the first cap wafer is further characterized in that the first cap wafer and the second cap wafer are laminated together.

15. The method of claim 11, wherein the semiconductor device comprises a MEM device.

16. The method of claim 11, wherein during the applying the vacuum, the forming the sealing layer over the first cap wafer further comprises forming the sealing layer within the one or more openings in the first cap wafer.

17. The method of claim 11, further comprising:
    singulating the device wafer, the first cap wafer, and the second cap wafer.

18. A semiconductor device, comprising:
    a first cap layer having one or more openings extending through the first cap layer;
    a second cap layer bonded to the first cap layer, the second cap layer having one or more openings extending through the second cap layer, wherein each of the one or more openings in the first cap layer are misaligned with respect to each of the one or more openings in the second cap layer;
    a sealing layer over the first cap layer, wherein the first cap layer is located between the sealing layer and the second cap layer, and wherein the sealing layer seals each of the one or more openings in the first cap layer;
    a device layer bonded to the second cap layer and comprising a MEM device; and
    a vacuum cavity between the device layer and the second cap layer, wherein the MEM device is in the vacuum cavity.

19. The semiconductor device of claim 18, further comprising:
    a vent path from a first opening of the one or more openings in the second cap layer to a second opening of the one or more openings in the first cap layer, the vent path located between the second cap layer and the first cap layer.

20. The semiconductor device of claim 18, further comprising:
    a vent path from a first opening of the one or more openings in the second cap layer to a second opening of the one or more openings in the first cap layer, the vent path located in at least one of the first cap layer or the second cap layer.

* * * * *